(12) United States Patent
Rapeanu et al.

(10) Patent No.: US 9,648,767 B2
(45) Date of Patent: May 9, 2017

(54) EMERGENCY LIGHTING ENCLOSURE WITH INTEGRATED ELECTRICAL BOX

(71) Applicant: Thomas & Betts International, Inc., Wilmington, DE (US)

(72) Inventors: Radu C. Rapeanu, Mont-Royal (CA); Michel Lambert, Saint-Eustache (CA)

(73) Assignee: Thomas & Betts International LLC, Wilmington, DE (US)

( * ) Notice: Subject to any disclaimer, the term of this patent is extended or adjusted under 35 U.S.C. 154(b) by 342 days.

(21) Appl. No.: 13/906,845

(22) Filed: May 31, 2013

(65) Prior Publication Data

US 2014/0009945 A1   Jan. 9, 2014

Related U.S. Application Data

(60) Provisional application No. 61/668,073, filed on Jul. 5, 2012.

(51) Int. Cl.
| | |
|---|---|
| *F21V 15/01* | (2006.01) |
| *H05K 5/03* | (2006.01) |
| *F21V 23/06* | (2006.01) |
| *F21S 9/02* | (2006.01) |

(52) U.S. Cl.
CPC ............... *H05K 5/03* (2013.01); *F21S 9/022* (2013.01); *F21V 23/06* (2013.01)

(58) Field of Classification Search
CPC . F21S 9/022; H05K 5/03; F21V 23/06; F21V 23/001; F21V 23/002
USPC ........... 362/374–375, 368; 174/50, 520, 559, 174/560, 535, 53, 57, 17 R, 59, 66, 67; 361/600, 601, 679.01; 220/3.2, 3.3, 4.02; 439/352
See application file for complete search history.

(56) References Cited

U.S. PATENT DOCUMENTS

| | | | |
|---|---|---|---|
| 3,931,689 A | 1/1976 | Shine | |
| 4,201,005 A | 5/1980 | Hunt | |
| 4,587,597 A | 5/1986 | Meyers | |
| 4,885,474 A | 12/1989 | Johnstone et al. | |
| 5,018,290 A | 5/1991 | Kozek et al. | |
| 5,045,232 A | 9/1991 | Dahanayake | |

(Continued)

FOREIGN PATENT DOCUMENTS

| | | |
|---|---|---|
| CA | 2130702 | 1/1999 |
| CA | 2531522 | 6/2006 |

(Continued)

*Primary Examiner* — Laura Tso
*Assistant Examiner* — Naomi M Wolford
(74) *Attorney, Agent, or Firm* — Taft Stettinius & Hollister LLP

(57) ABSTRACT

A lighting equipment enclosure comprises a front plate assembly and a back plate assembly. The back plate assembly comprises a back plate including a partition that defines an area of the back plate, wherein the area includes a first access point and a second access point. The back plate assembly also comprises a snap electrical connector, a set of wires that extend from the snap electrical connector, and a partition cover that is attachable to the back plate, wherein when the partition cover is in a closed position, the partition cover covers a substantial portion of the area. The partition and the partition cover form a space in which electrical wires from independent power supplies may be attached to the sets of wires.

20 Claims, 7 Drawing Sheets

(56) References Cited

U.S. PATENT DOCUMENTS

| | | | |
|---|---|---|---|
| 5,797,673 A | 8/1998 | Logan et al. | |
| 6,045,242 A | 4/2000 | Wegrzyn et al. | |
| 6,050,013 A | 4/2000 | Heaton et al. | |
| 6,082,031 A | 7/2000 | Heaton et al. | |
| 6,095,670 A | 8/2000 | Vosika et al. | |
| 6,132,070 A | 10/2000 | Vosika et al. | |
| 6,142,648 A | 11/2000 | Logan et al. | |
| 6,220,721 B1* | 4/2001 | Chan | F21S 2/00 362/219 |
| 6,499,866 B1 | 12/2002 | Logan et al. | |
| 6,848,798 B1 | 2/2005 | Logan et al. | |
| 7,220,014 B2 | 5/2007 | Lay et al. | |
| 7,357,541 B2* | 4/2008 | Gamache et al. | 362/448 |
| 7,581,844 B1 | 9/2009 | Yang | |
| 8,021,007 B2 | 9/2011 | Rapeanu et al. | |
| 2003/0116338 A1* | 6/2003 | Pearce | 174/50 |
| 2006/0072304 A1* | 4/2006 | Lay et al. | 362/157 |
| 2010/0020527 A1 | 1/2010 | Fiermuga | |
| 2012/0086576 A1* | 4/2012 | Lin | H02J 9/065 340/632 |

FOREIGN PATENT DOCUMENTS

| | | |
|---|---|---|
| CA | 2584488 | 10/2007 |
| CA | 2654836 | 8/2009 |

\* cited by examiner

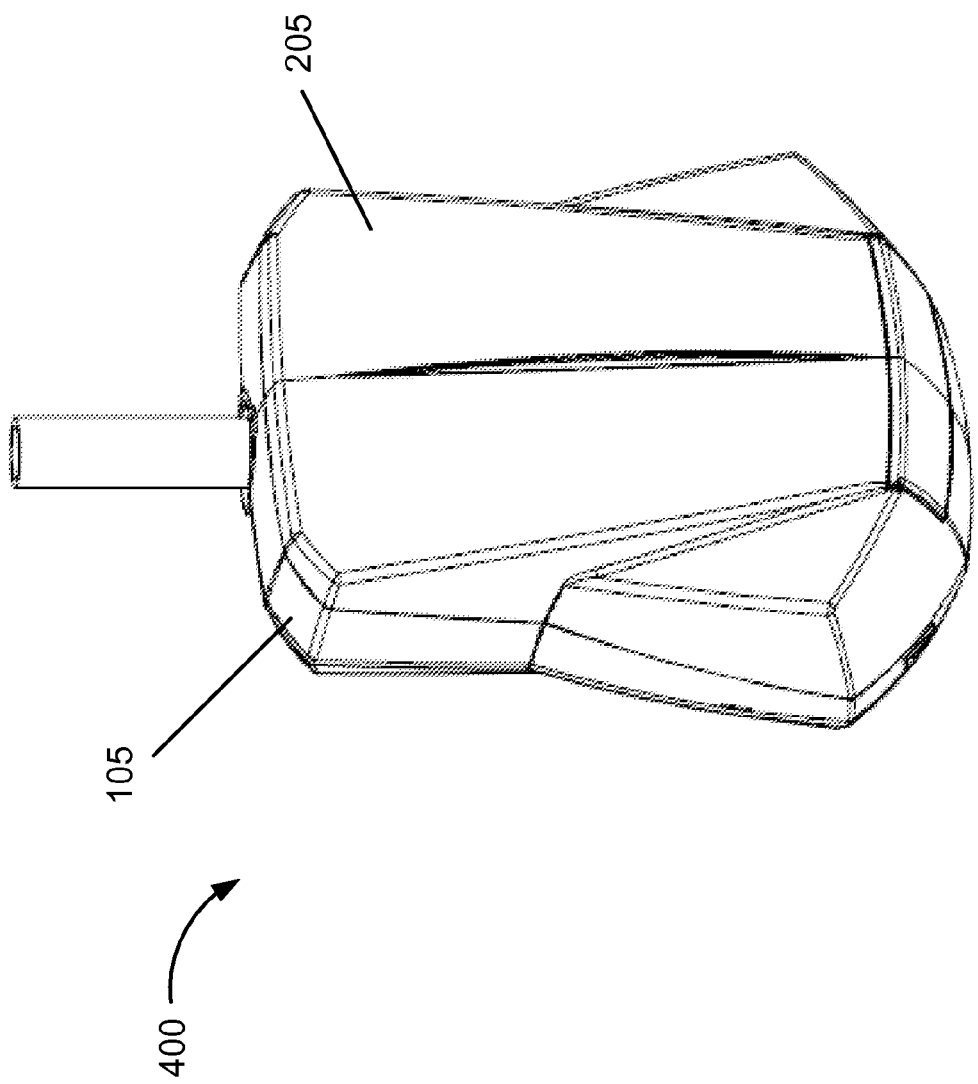

EMERGENCY LIGHTING ENCLOSURE WITH INTEGRATED ELECTRICAL BOX

CROSS-REFERENCE TO RELATED APPLICATION

This application claims priority under 35 U.S.C. §119, based on U.S. Provisional Patent Application No. 61/668,073, filed on Jul. 5, 2012, the disclosure of which is hereby incorporated by reference herein.

BACKGROUND

Traditionally, the electrical connection of emergency lighting equipment to the utility AC line (e.g., 120 volts, 230 volts, etc.) is made in an electrical box or junction box that is separate or outside from the lighting equipment. The electrical box is recessed or surface-mounted on a wall or a ceiling. Some types of equipment include a power cord and plug for connection to a regular power outlet.

BRIEF DESCRIPTION OF THE DRAWINGS

FIG. 4 is a diagram illustrating a view of an assembled power supply enclosure that includes the back plate assembly and the front plate assembly.

DETAILED DESCRIPTION OF PREFERRED EMBODIMENTS

Figure 1A:
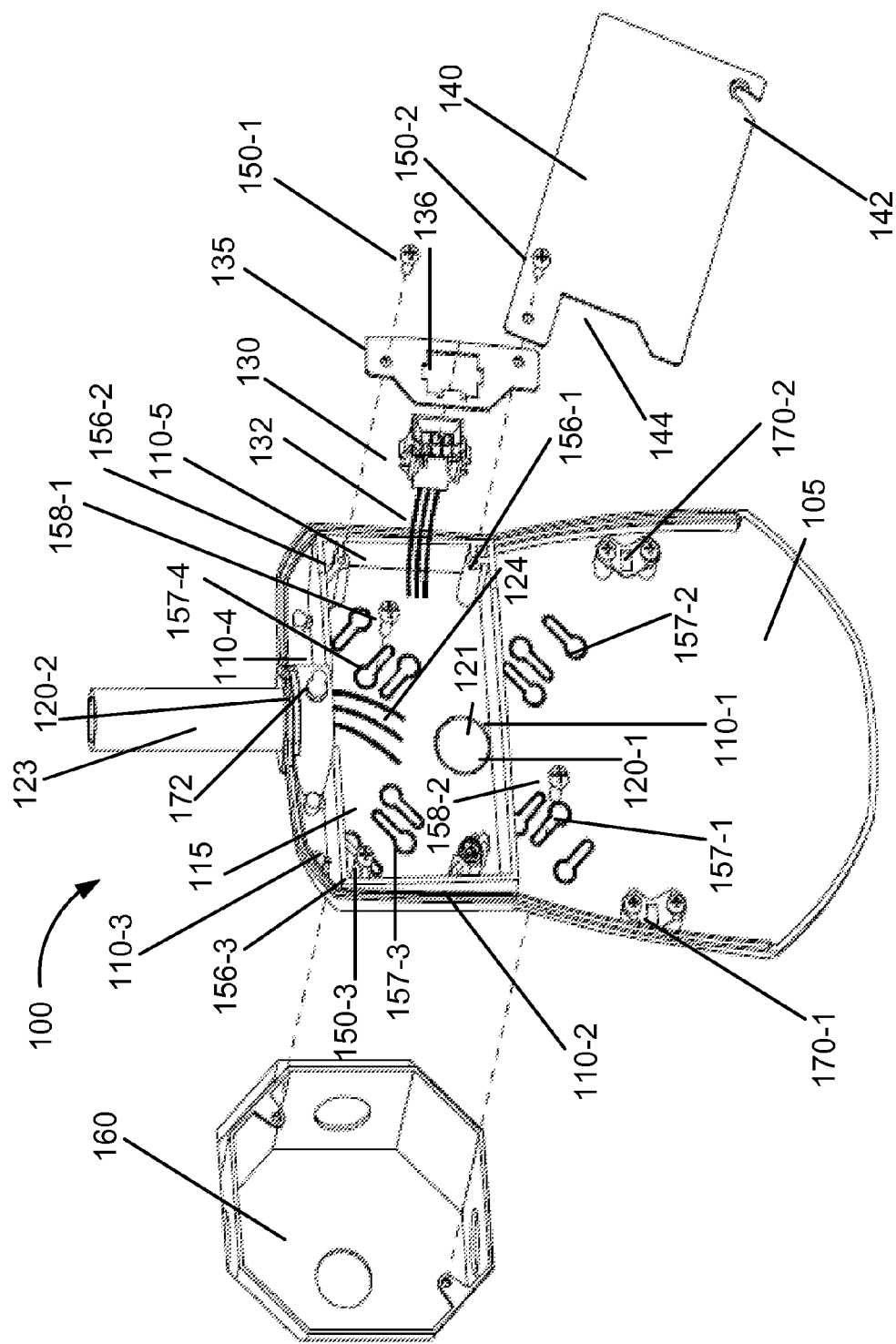
FIG. 1A is a diagram illustrating an exploded view of an exemplary embodiment of a back plate assembly.

The following detailed description refers to the accompanying drawings. The same reference numbers in different drawings may identify the same or similar elements.

In the specification and illustrated by the drawings, reference is made to "an exemplary embodiment," "an embodiment," "embodiments," etc., which may include a particular feature, structure or characteristic in connection with an embodiment(s). However, the use of the phrase or term "an embodiment," "embodiments," etc., in various places in the specification does not necessarily refer to all embodiments described, nor does it necessarily refer to the same embodiment, nor are separate or alternative embodiments necessarily mutually exclusive of other embodiment(s).

As previously described, the electrical connection of emergency lighting equipment to the utility power is made in the electrical box that is separate or outside from the lighting equipment. Some other types of emergency lighting equipment include a power cord or an external canopy to host wires and the connections thereto. Unfortunately, these current approaches make it very difficult for installers to install lighting equipment having a dual-mode function. Lighting equipment that includes a dual-mode function provide emergency lighting and normal lighting (i.e., serves as a regular lighting fixture). The normal lighting circuit may include an electrical switch.

According to various regulations (e.g., building, etc.) and safety standards (e.g., Underwriters Laboratories, Inc. (UL), Canadian Standards Association (CSA), etc.), dual-mode lighting equipment must be powered by two independent circuits. For example, one independent AC line dedicated to emergency lighting and another independent AC line dedicated for normal lighting. Additionally, there are safety regulations that require that the two independent circuits be electrically isolated from one another.

From the perspective of an installer, the installation of two independent sets of wires through the same junction box is challenging. The existing manner of installation allows the electrical connections to be made inside the lighting equipment as opposed to the junction box outside of the lighting equipment. This approach, however, has several disadvantages. For example, this approach requires additional space, which is dedicated to wires and connections, inside the lighting equipment. Additionally, for example, the number of wires (e.g., usually three incoming wires and four outgoing wires for each AC line) makes it difficult for the installer to guide or cluster the wires during installation. Also, for example, after the connection of the wires, the wires are loose and unorganized in the lighting equipment, which makes it difficult for the installer to close the lighting equipment in order to complete the installation. To facilitate the installation, some manufacturers provide wires with in-line connectors. However, this method still requires excessive space in the lighting equipment and still yields a cumbersome installation for the installer.

According to an exemplary embodiment, an emergency lighting enclosure is described. According to an exemplary embodiment, the emergency lighting enclosure includes a front plate and a back plate. According to an exemplary embodiment, the back plate includes multiple access points to feed or run electrical wires from multiple power supplies to an inner side of the back plate. According to an exemplary embodiment, the back plate includes an electrical snap connector. The electrical snap connector includes power supply wires that extend from the electrical snap connector. These power supply wires are connectable to the electrical wires that run from the multiple power supplies to the back plate.

According to an exemplary embodiment, the inner side of the back plate includes a partition that defines a space or an area to connect the electrical wires from a power supply to the power supply wires of the electrical snap connector. In this way, an installer may have limited contact with wires. According to an exemplary embodiment, the partition is defined by walls that extend substantially perpendicular from the inner side of the back plate.

According to an exemplary embodiment, the back plate includes a partition cover to cover the area defined by the partition. In this way, the wires and wire connections may be retained inside the partition area. According to an exemplary embodiment, the back plate includes knock-outs for keyholes that can be opened and used to affix the back plate to a wall or on an external junction box.

Figure 1B:
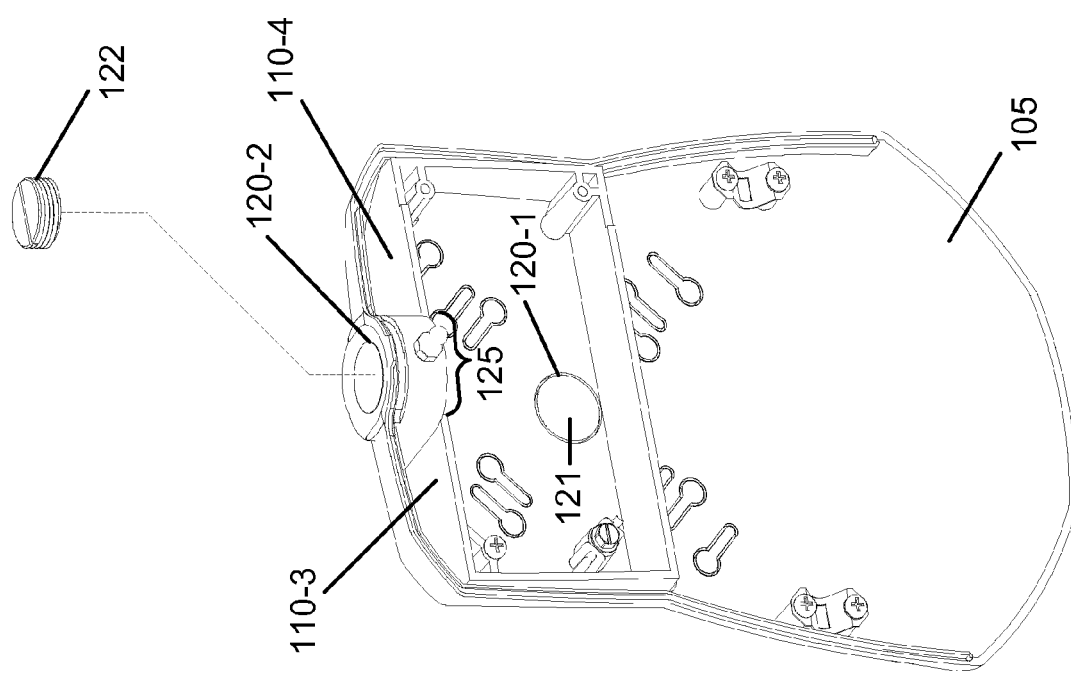
FIG. 1B is a diagram illustrating another view of the back plate assembly depicted in FIG. 1A.

FIG. 1A is a diagram illustrating an exploded view of an exemplary embodiment of a back plate assembly 100. As illustrated, back plate assembly 100 includes a back plate 105. Back plate 105 may be made from metal or plastic. Back plate 105 includes walls 110-1 through 110-5 (also referred to collectively as walls 110) that extend substantially perpendicular from an inner surface 115 of back plate 105 and form a partition that defines an area of back plate 105 to connect wires. Walls may be tooled (e.g., die-cast) in back plate 105. Back plate 105 includes access points 120-1 and 120-2 (also referred to collectively as access points 120 and individually as access point 120). For example, access point 120-1 may be implemented as a knock-out and access point 120-2 may be implemented as a threaded hole, as illustrated in FIG. 1B. Access points 120 allow entry into the area formed by the partition for wires from two independent power sources. For example, as illustrated in FIG. 1A, a conduit 123 that includes electrical wires 124 may be fed to the area via access point 120-2. An access point wall 125 exists between wall 110-3 and wall 110-4 to allow electrical wires 124 to be fed to the area defined by walls 110, as illustrated in FIG. 1B. Conduit 123 and electrical wires 124 are not a part of back plate assembly 100. Back plate assembly 100 includes a plug 122, as illustrated in FIG. 1B, which may be removed or left in access point 120-2 depending on whether access point 120-2 is being used for feeding wires from a power source. Similarly, a knock-out 121 may be left in or removed for access point 120-1.

As further illustrated, back plate assembly 100 includes a snap electrical connector 130 from which wires 132 extend. According to an exemplary implementation, snap electrical connector 130 includes two rows of wires 132 for connection to independent power supplies. For example, each row includes several wires 132 to accommodate different values of an AC line voltage (e.g., neutral, 120 V, 277 V, ground, etc.). Back plate assembly 100 includes a snap electrical connector plate 135. Snap electrical connector plate 135 includes a hole 136 that is shaped to receive snap electrical connector 130.

Back plate assembly 100 includes a partition cover 140 that is shaped to cover the area defined by walls 110. Partition cover 140 includes a notch 142 and a notch 144. As described further below and illustrated in FIG. 1D, notch 142 provides an attachment point for partition cover 140 to back plate 140. Additionally, notch 144 is contoured to receive or provide space for a portion of snap electrical connector plate 135. Screws 150-1 through 150-3 (also referred to collectively as screws 150 and individually as screw 150) may be used to attach snap electrical connector plate 135 and partition cover 140 to back plate 105.

Back plate 105 includes screw holes 156-1 through 156-3 (also referred to collectively as screw holes 156 and individually as screw hole 156). Back plate 105 includes various knock-outs dispersed throughout back plate 105, such as knock-outs 157-1 through 157-4 (also referred to collectively as knock-outs 157 and individually as knock-out 157).

Screws 158-1 and 158-2 may be used to attach a cover 160 via knock-outs 157-1 and 157-4. Cover 160 is not a part of back assembly 100. Rather, cover 160 represents an electrical box that may be recessed, for example, in a wall. The electrical box may supply power supply wires (not illustrated) to back plate 105 via access point 120-1 after removing knockout 121. In this way, independent power supply wires may fed to back plate assembly 100 via access point 120-2 (e.g., using a conduit), via access point 120-1 (e.g., from an electrical box), or both. Clips 170-1 and 170-2 (also referred to collectively as clips 170), which are disposed on the inner surface of back plate 105, are designed to receive ball studs of a front plate assembly (not illustrated) and allow an installer to snap together back plate assembly 100 with a front plate assembly. For example, clips 170 may be implemented as spring brackets. Additionally, the inner surface of back plate 105 includes a ball stud 172 that can be inserted into a clip of front plate assembly (not illustrated).

Figure 1C:
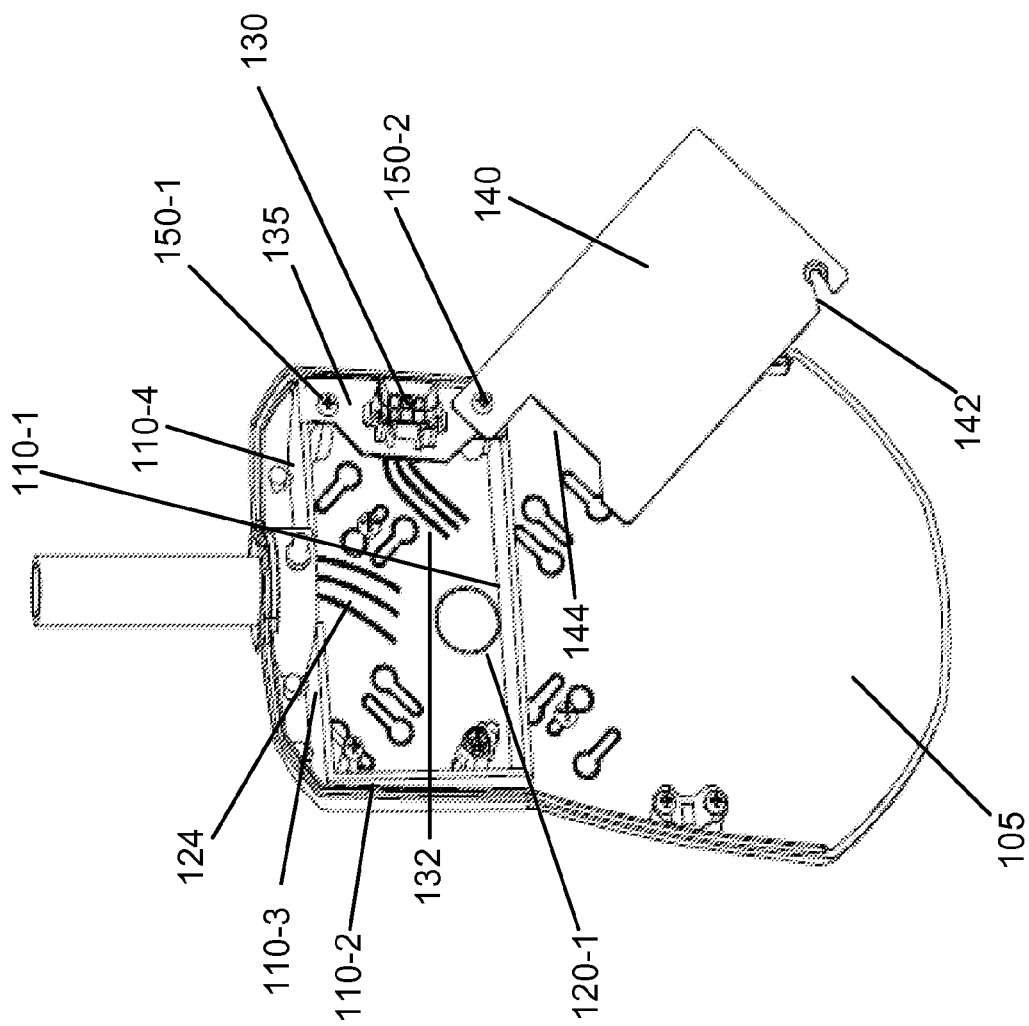
FIG. 1C is a diagram illustrating the back plate assembly depicted in FIG. 1A.

FIG. 1C is a diagram illustrating back plate assembly 105 that is partially assembled. As illustrated partition cover 140 is in a position to allow an installer access to the area defined by walls 110. Partition cover 140 is rotatable about an axis provided by screw 150-2. Screw 150-2 also secures snap electrical connector plate 135 to back plate assembly 105.

According to an exemplary installation process, an installer may connect wires 124 to wires 132 while partition cover 140 is in an open position. If other wires (not illustrated) are fed through access point 120-1, these wires could also be connected to wires 132. In this way, the installer may connect wires from two independent power sources to snap electrical connector 130.

Figure 1D:
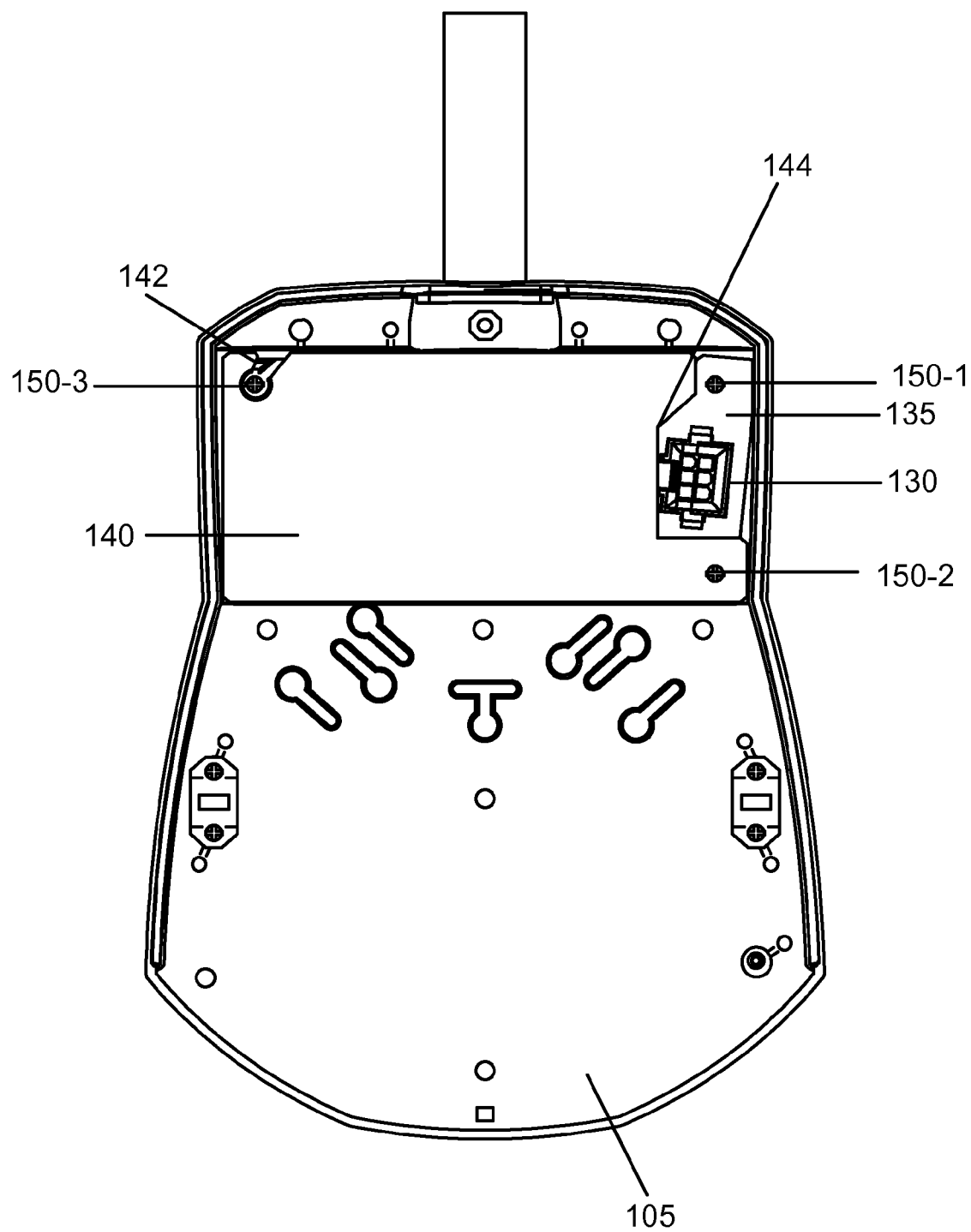
FIG. 1D is a diagram illustrating the back plate assembly in which a partition cover is in a closed position.

FIG. 1D is a diagram illustrating back plate assembly 105 in which partition cover 140 is in a closed position. According to an exemplary installation process, an installer positions notch 142 to be received by screw 150-3. Partition cover 140 rests on top of walls 110. Notch 144 provides an opening to expose a portion of snap electrical connector plate 135. A portion of snap electrical connector plate 135 is underneath a portion of partition cover 140. Additionally, as illustrated, notch 144 provides an opening to expose snap electrical connector 130. Although not illustrated, electrical wires (e.g., electrical wires of conduit 123 and/or wires fed through access point 120-1 (e.g., from a junction box)) may be connected to wires 132 of snap electrical connector 130, which are behind partition cover 140. In this way, electrical wires, electrical wire connectors, etc., are retained in the electrical box defined by walls 110, partition cover 140, etc. The electrical wires and electrical connectors cannot expand and overflow to other portions of back plate assembly 100. Additionally, the electrical box allows an installer to assemble back plate assembly 100 with a front plate assembly in less cumbersome manner.

Figure 2:
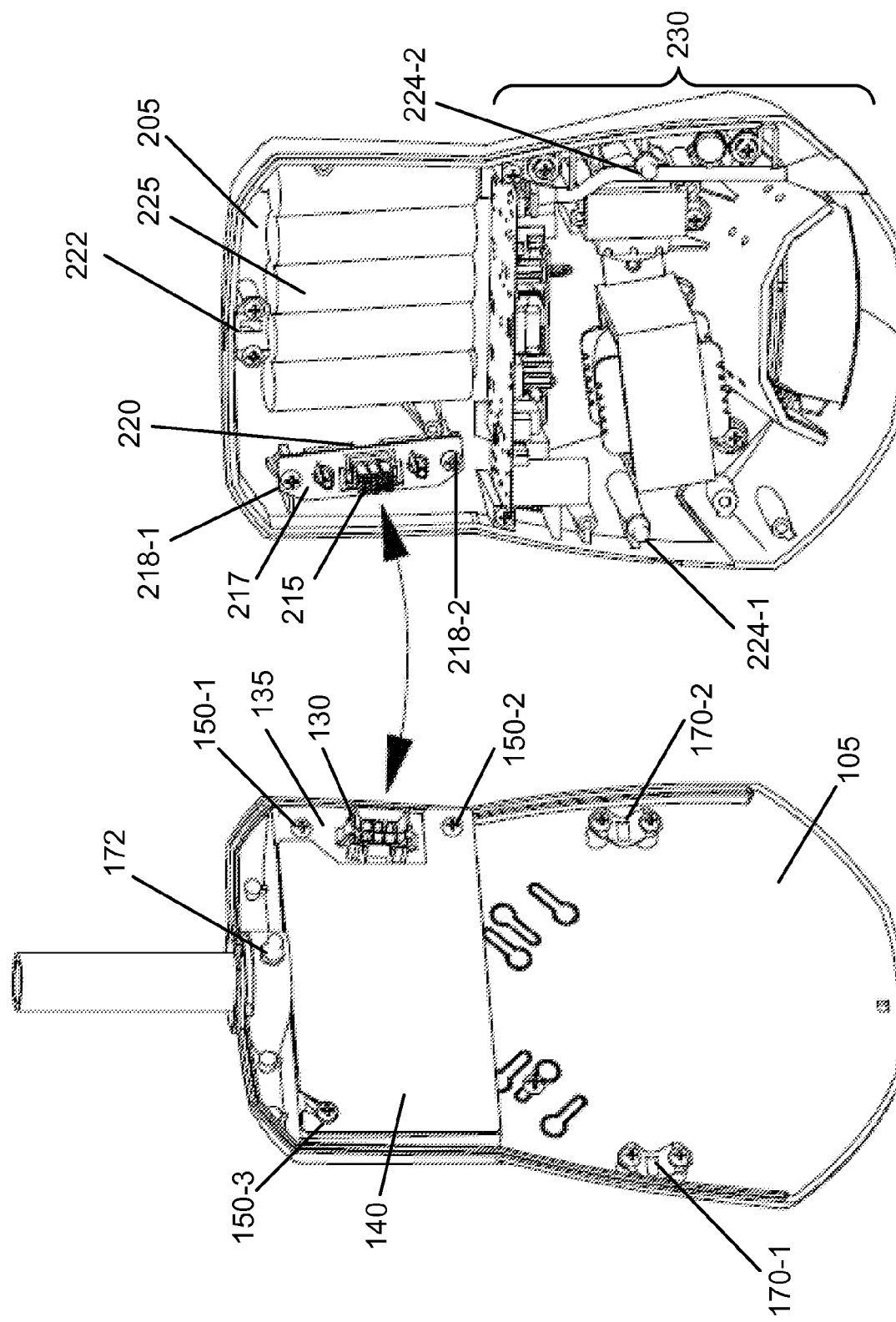
FIG. 2 is a diagram illustrating the back plate assembly and a front plate assembly.

FIG. 2 is a diagram illustrating back plate assembly 105 and a front plate assembly 205. As illustrated, front plate assembly 205 has a general shape that complements back plate assembly 105. Front plate assembly 215 includes a snap electrical connector 215. A snap electrical connector plate 217 is secured to front plate assembly 205 using screws 218-1 and 218-2. Snap electrical connector plate 217 includes a hole 220 to allow snap electrical connector 215 to protrude from snap electrical connector plate 217.

Front plate assembly 205 also includes a clip 222 to be received by ball stud 172 of back plate assembly 105. Additionally, front plate assembly 205 includes ball studs 224-1 and 224-2 to be received by clips 170 of back plate assembly 105.

As further illustrated, front plate assembly 205 may include various components, such as batteries 225 and components 230. For example, components 230 may include a printed circuit board, transformers, light emitting diodes or some other type of light source or circuitry to provide an emergency light source and a normal light source.

Figure 3:
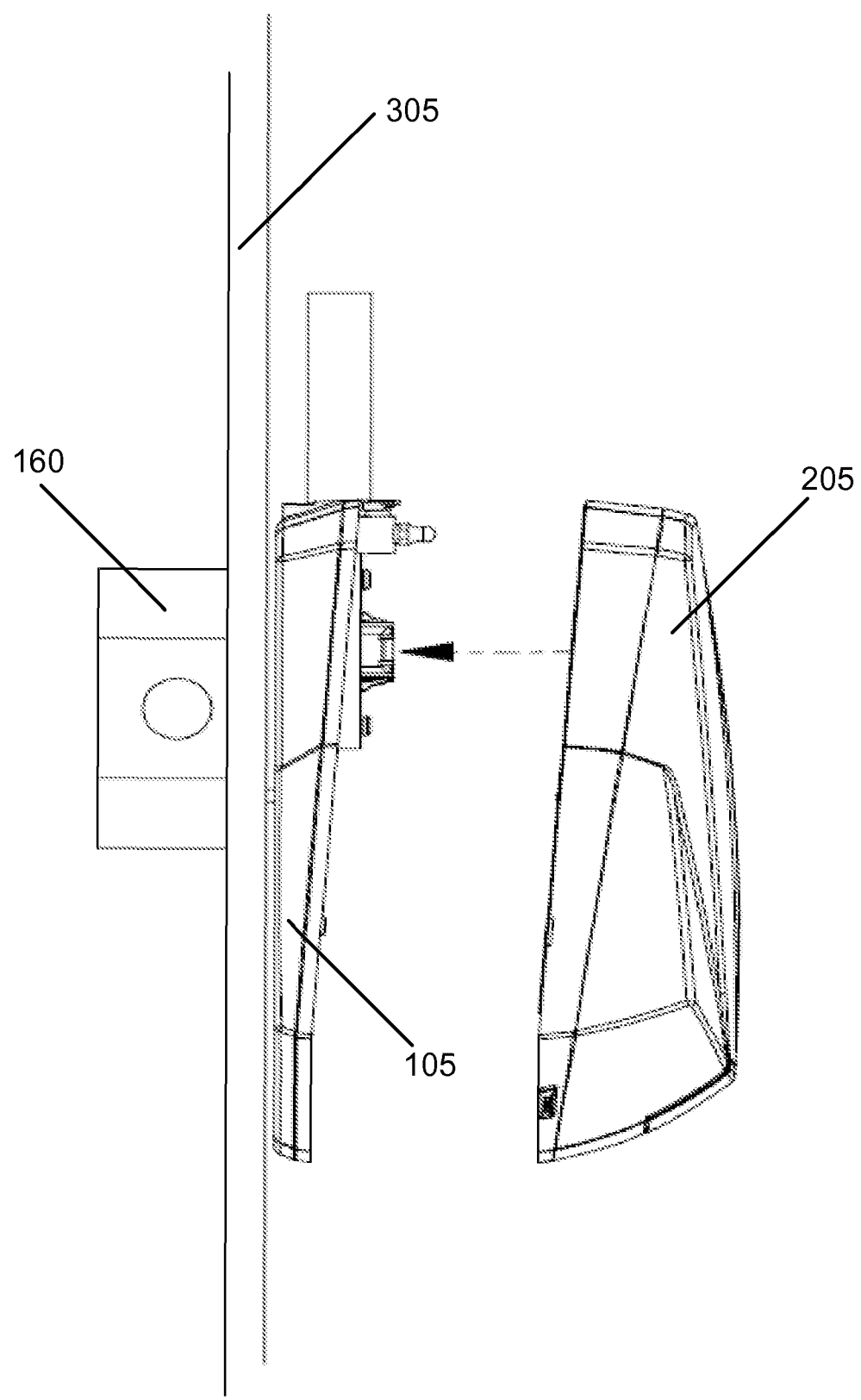
FIG. 3 is a diagram illustrating a side view of the back plate assembly and the front plate assembly.

FIG. 3 is a diagram illustrating a side view of back plate assembly 105 and front plate assembly 205. According to this example, back plate assembly 105 is secured to a wall 305. As indicated by the dotted arrow, an installer may snap on front plate assembly 205 to back plate assembly 105. As previously described, the electrical box (e.g., walls 110, partition cover 140, snap electrical connector plate 135, etc.) retain the electrical wires and electrical connectors and prevent interference during assembly.

FIG. 4 is a diagram illustrating a lighting equipment enclosure 400 that includes back plate assembly 105 and front plate assembly 205. As illustrated, back plate assembly 105 and front plate assembly 205 are coupled together to form lighting equipment enclosure 400. When an installer uncouples or unsnaps front plate assembly 205 from back plate assembly 105, the electrical connection between back plate assembly 105 and front plate assembly 205 may be broken. According to such a circumstance, the installer's risk of harm may be reduced. Additionally, the installer may not need to interrupt the power source feed from, for example, a main breaker of a building before servicing.

In view of back plate assembly 105, the installer may replace the front plate assembly 205 without removing back plate assembly 105. This may reduce the time spent, by the installer, for repairing lighting equipment enclosure 400.

The terms "a," "an," and "the" are intended to be interpreted to include one or more items. Further, the phrase "based on" is intended to be interpreted as "based, at least in part, on," unless explicitly stated otherwise. The term "and/or" is intended to be interpreted to include any and all combinations of one or more of the associated items.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

The foregoing description of embodiments provides illustration, but is not intended to be exhaustive or to limit the embodiments to the precise form disclosed. Accordingly, modifications to the embodiments described herein may be possible. Thus, although the invention has been described in detail above, it is expressly understood that it will be apparent to persons skilled in the relevant art that the invention may be modified without departing from the spirit of the invention. Various changes of form, design, number of, or arrangement may be made to the invention without departing from the spirit and scope of the invention. Therefore, the above-mentioned description is to be considered exemplary, rather than limiting, and the true scope of the invention is that defined in the following claims.

What is claimed is:

1. A back plate assembly of a lighting equipment enclosure comprising:
    a back plate having an inner side that includes a partition that protrudes from a portion of the inner side and defines an area, wherein a back plate portion within the area includes a first access point to the area, and the partition includes a second access point to the area;
    a snap electrical connector including a snap connector and two rows of power supply wires, at least a portion of the snap electrical connector positioned within the area, wherein each row includes multiple power supply wires and each power supply wire of the multiple power supply wires includes a first end, which connects to and extends from the snap connector, and a second end, which terminates within the area and is unconnected, and wherein the multiple power supply wires of each row, at the second ends, are structured to receive different voltages to supply power, and wherein the snap electrical connector is configured to supply power to an emergency light and a normal light of the lighting equipment enclosure; and
    a partition cover that is pivotably attachable to the back plate, wherein when the partition cover is attached to the back plate, the partition cover is selectively pivotable between (1) an open position away from the snap electrical connector and in which the partition cover is positioned to provide access to the area, and (2) a closed position in which the partition cover provides a covering for a substantial portion of the area and covers only a portion of the snap electrical connector.

2. The back plate assembly of claim 1, wherein the partition includes walls that extend substantially perpendicular from the inner side of the back plate.

3. The back plate assembly of claim 1, wherein the inner side includes another area, which is outside the partition, that provides a covering of the emergency light and the normal light.

4. The back plate assembly of claim 1, further comprising:
    a snap electrical connector plate that includes a hole to allow the snap electrical connector to protrude from the snap electrical connector plate, and wherein the snap electrical connector plate provides a covering for a remainder portion of the area.

5. The back plate assembly of claim 4, wherein the back plate further comprises: screw holes to receive screws, wherein the screw holes are disposed within the area of the back plate, and wherein one of the screw holes is configured to receive a screw to attach the partition cover and the snap electrical connector plate to the back plate.

6. The back plate assembly of claim 4, wherein the partition cover includes a notch to provide a space for a portion of the snap electrical connector plate, the notch sized for the partition plate to cover only a portion of the snap electrical connector plate when the partition cover is in the closed position and uncovers the portion of the snap electrical connector plate when the partition cover is in the open position.

7. The back plate assembly of claim 6, wherein the partition cover includes another notch to receive a screw that pivotally attaches the partition cover to the back plate.

8. The back plate assembly of claim 7, wherein the first access point and the second access point are each configured to receive wires from two independent power supplies external from the lighting equipment enclosure, and wherein the partition cover is structured for locking engagement with the snap electrical connector plate, the locking engagement securing the partition cover in the closed position.

9. A lighting equipment enclosure comprising:
    a front plate assembly comprising:
        a first snap electrical connector;
        a lighting source;
    a back plate assembly comprising:
        a back plate having an inner side that includes a partition that protrudes from a portion of the inner side and defines an area, wherein a back plate portion within the area includes a first access point to the area, and the partition defines a second access point to the area;
        a second snap electrical connector connectable to the first snap electrical connector, at least a portion of the snap electrical connector positioned within the area, wherein the second snap electrical connector includes a snap connector and two rows of power supply wires, wherein each row includes multiple power supply wires and each power supply wire of the multiple power supply wires includes a first end, which connects to and extends from the snap connector, and a second end, which terminates within the area and is unconnected, and wherein the multiple power supply wires of each row, at the second ends, are structured to receive different voltages to supply power; and
        a partition cover that is pivotably attachable to the back plate to selectively pivot between (1) an open position away from the snap electrical connector and in which the partition cover is positioned to provide access to the area and (2) a closed position wherein the partition cover rests on a surface of the partition and covers a substantial portion of the area and covers only a portion of the snap electrical connector.

10. The lighting equipment enclosure of claim 9, wherein the lighting source includes an emergency light and a normal light, and wherein the snap electrical connector is configured to supply power to the emergency light and a normal light.

11. The lighting equipment enclosure of claim 10, wherein the first access point and the second access point are each configured to receive wires from two independent power supplies.

12. The lighting equipment enclosure of claim 9, wherein the back plate assembly further comprises:
    a snap electrical connector plate that includes a hole to allow the second snap electrical connector to protrude from the snap electrical connector plate, and wherein the snap electrical connector plate provides a covering for a remainder portion of the area.

13. The lighting equipment enclosure of claim 12, wherein the partition cover includes a notch to provide a space for a portion of the snap electrical connector plate, the notch sized for the partition plate to cover only a portion of the snap electrical connector plate when the partition cover is in the closed position and uncovers the portion of the snap electrical connector plate when the partition cover is in the open position.

14. The lighting equipment enclosure of claim 12, wherein a portion of the snap electrical connector plate is underneath a portion of the partition cover when the partition cover is in a closed position.

15. The lighting equipment enclosure of claim 14, wherein the back plate assembly includes knockouts configured to receive screws for attaching the back plate assembly to a surface, and wherein the partition cover is structured for locking engagement with the snap electrical connector plate, the locking engagement securing the partition cover in the closed position.

16. The lighting equipment enclosure of claim 9, wherein the back plate back plate further comprises:
    screw holes to receive screws, wherein the screw holes are disposed within the area of the back plate, and wherein one of the screw holes is configured to receive a screw to attach the partition cover and a snap electrical connector plate to the back plate when the partition cover is in the closed position.

17. A lighting equipment enclosure comprising:
    a front plate assembly comprising;
        an emergency light and a normal light;
    a back plate assembly comprising:
        a back plate including a partition that defines a partial area of the back plate, wherein the partial area includes a first access point and a second access point;
        a snap electrical connector including a snap connector and two rows of power supply wires, wherein each row includes multiple power supply wires and each power supply wire of the multiple power supply wires includes a first end, which connects to and extends from the snap connector, and a second end, which terminates within the partial area and is unconnected, and wherein the multiple power supply wires of each row, at the second ends, are structured to receive different voltages to supply power, and wherein the snap electrical connector is configured to supply power to the emergency light and the normal light; and
        a partition cover that is attachable to the back plate, wherein the partition cover is selectively pivotable between (1) an open position away from the snap electrical connector and in which the partition cover is positioned to provide access to the area and (2) a closed position in which the partition cover covers a substantial portion of the partial area and covers only a portion of the snap electrical connector.

18. The lighting equipment enclosure of claim 17, wherein the first access point and the second access point are each configured to receive wires from two independent power sources, and wherein the first access point includes a knock-out.

19. The lighting equipment enclosure of claim 17, the front plate assembly comprising:
    another snap electrical connector that is connectable to the snap electrical connector of the back plate assembly; and
    the emergency light source and the normal light source, and wherein a remainder area of the back plate defined outside of the partition, provides a covering of the emergency light source and the normal light source when the back plate assembly is joined with the front plate assembly.

20. The lighting equipment enclosure of claim 17, wherein the partition cover includes a notch to provide a space for a snap electrical connector plate that secures the snap electrical connector to the back plate, and wherein the snap electrical connector plate provides a covering for a remainder portion of the partial area.

* * * * *